(12) United States Patent
Saracco et al.

(10) Patent No.: US 9,798,149 B1
(45) Date of Patent: Oct. 24, 2017

(54) DEVICES AND METHODS FOR OPTICAL POWER SENSING SCANNING LASER PROJECTORS

(71) Applicant: Microvision, Inc, Redmond, WA (US)

(72) Inventors: Matthieu Saracco, Redmond, WA (US); James Michael Hansen, Redmond, WA (US)

(73) Assignee: Microvision, Inc., Redmond, WA (US)

( * ) Notice: Subject to any disclaimer, the term of this patent is extended or adjusted under 35 U.S.C. 154(b) by 0 days.

(21) Appl. No.: 15/189,466

(22) Filed: Jun. 22, 2016

(51) Int. Cl.
| | |
|---|---|
| G03B 21/20 | (2006.01) |
| H04N 9/31 | (2006.01) |
| G02B 27/10 | (2006.01) |
| H01S 3/13 | (2006.01) |
| G03B 21/00 | (2006.01) |

(52) U.S. Cl.
CPC ......... G02B 27/108 (2013.01); G03B 21/008 (2013.01); H01S 3/1305 (2013.01); H04N 9/3161 (2013.01); G03B 21/2053 (2013.01); H04N 9/3129 (2013.01)

(58) Field of Classification Search
CPC ............ G03B 21/2033; G03B 21/2053; H04N 9/3129; H04N 9/3135; H04N 9/3161; G02B 27/108; H01S 3/1305
See application file for complete search history.

(56) References Cited

U.S. PATENT DOCUMENTS

| | | | | |
|---|---|---|---|---|
| 2009/0046253 A1* | 2/2009 | Sunaga | ................. | G02B 27/283 353/20 |
| 2009/0237622 A1* | 9/2009 | Nishioka | ............... | H04N 9/3155 353/85 |
| 2011/0068426 A1* | 3/2011 | Zheng | ................... | G01J 1/4204 257/432 |

* cited by examiner

*Primary Examiner* — Ryan Howard
(74) *Attorney, Agent, or Firm* — Kevin D. Wills

(57) ABSTRACT

Devices and methods are described herein to measure optical power in scanning laser projectors. In general, the devices and methods utilize a filter component and photodiode to measure optical power being generated by at least one laser light source, with the filter component configured to at least partially compensate for the non-uniform electric current response of the photodiode. Such a configuration facilitates accurate optical power measurement using only one photodiode, and thus can facilitate accurate optical power measurement in a relatively compact device and with relatively low cost.

17 Claims, 15 Drawing Sheets

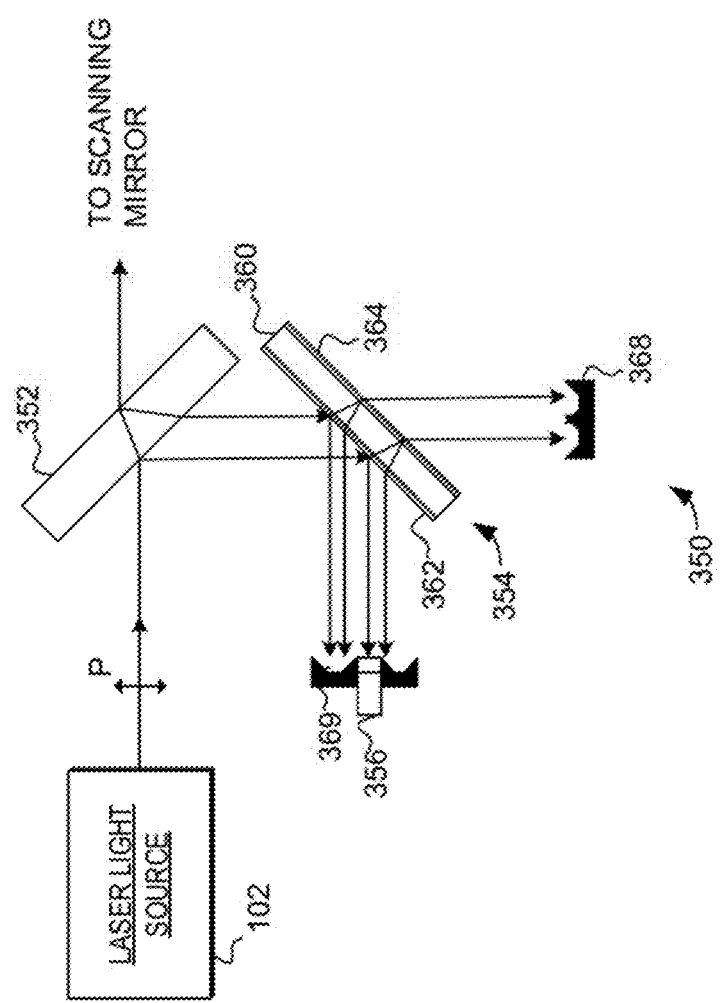

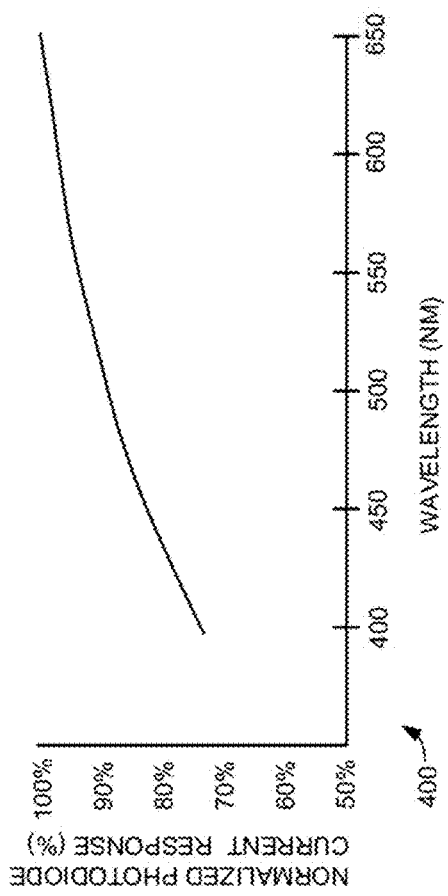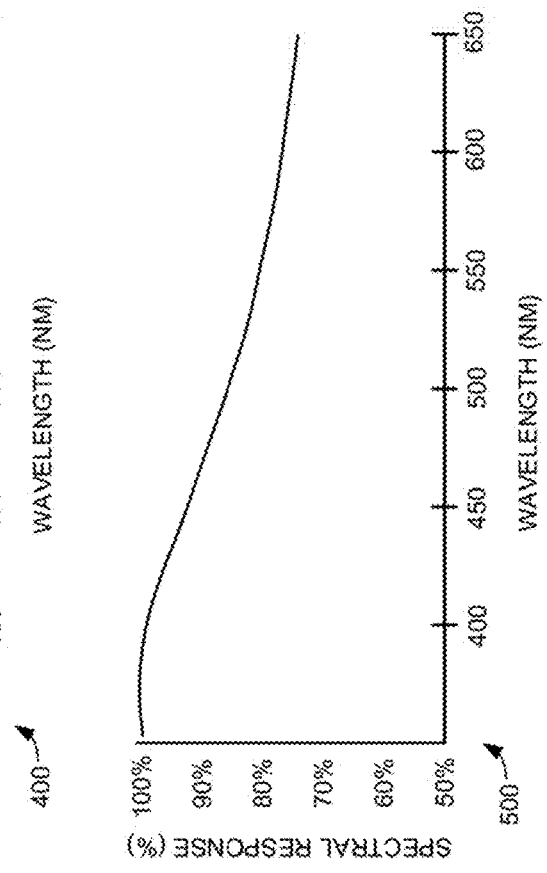

DEVICES AND METHODS FOR OPTICAL POWER SENSING SCANNING LASER PROJECTORS

FIELD

The present disclosure generally relates to projectors, and more particularly relates to scanning laser projectors.

BACKGROUND

In scanning laser projectors, pixels are typically generated by modulating light from laser light sources as a scanning mirror scans the modulated light in a raster pattern. In scanning laser projectors it is generally desirable to have measurements of optical power being generated by the laser light sources. Such measurements can be used to provide feedback to accurately control the laser light sources. Unfortunately, some previous techniques for measuring the optical power generated by laser light sources have been excessively bulky and/or costly.

As such, there remains a need for improved devices and methods for measuring the optical power generated by laser light sources in a in a scanning laser projector.

BRIEF DESCRIPTION OF THE DRAWINGS

FIGS. 3A, 3B, 3C, 3D and 3E show schematic views of optical power sensors in accordance with various embodiments of the present invention;

FIGS. 4A and 4B show graphical representations of an exemplary electric current response and spectral response in accordance with various embodiments of the present invention;

DESCRIPTION OF EMBODIMENTS

The embodiments described herein provide devices and methods for measuring optical power in scanning laser projectors. In general, the devices and methods utilize a filter component and photodiode to measure optical power being generated by at least one laser light source, with the filter component configured to at least partially compensate for the non-uniform electric current response of the photodiode. Such a configuration facilitates accurate optical power measurement using only one photodiode, and thus can facilitate accurate optical power measurement in a relatively compact device and with relatively low cost.

Figure 1:
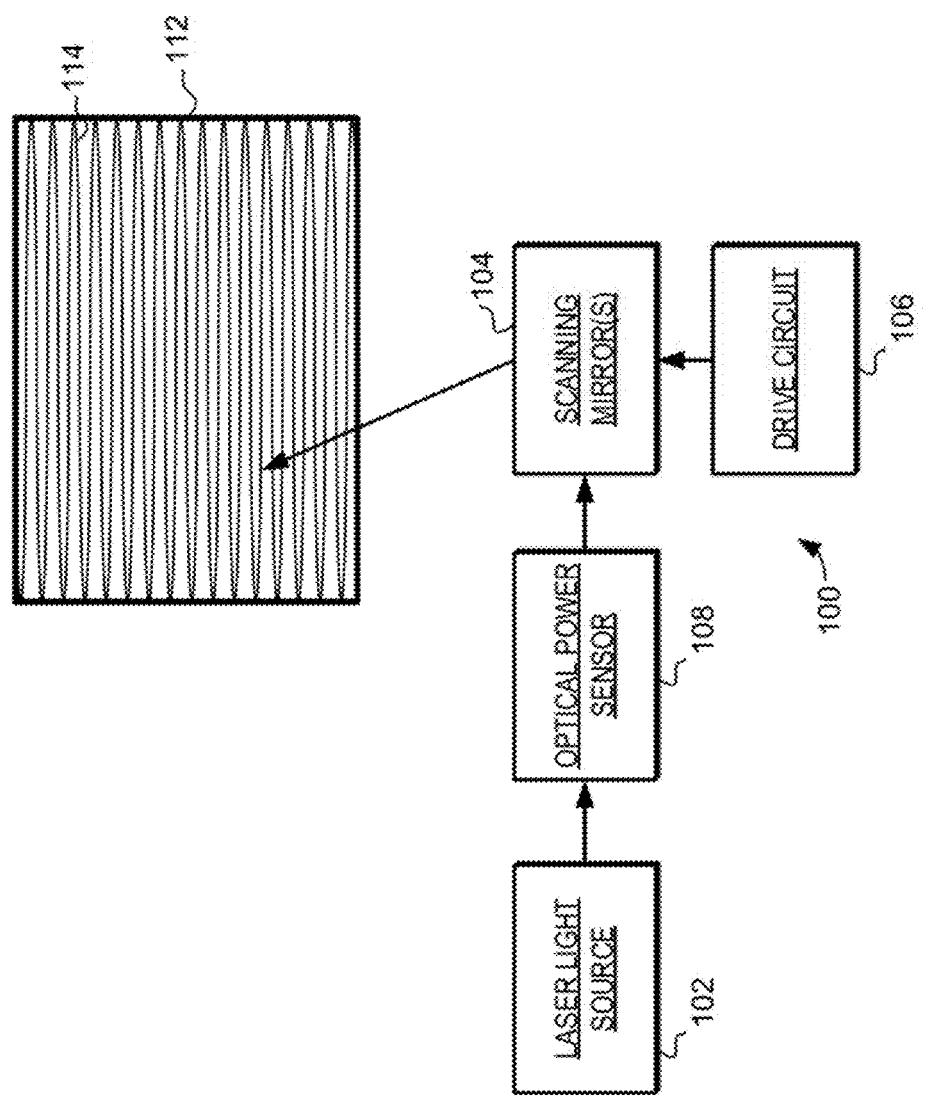
FIG. 1 shows a schematic diagram of a scanning laser projector in accordance with various embodiments of the present invention.

In one embodiment, the optical power sensor is included in scanning laser projector that uses multiple laser light sources to generate a combined laser beam. For example, in a scanning laser projector that uses red, green and blue lasers to form a laser beam. This combined laser beam has a relatively large combined wavelength range, and photodiodes typically have a significant non-uniform electric current response over such a wide wavelength range. Thus, in accordance with the embodiments described herein, the optical power sensor is configured such that filter component at least partially compensates for non-uniform electric current response over the wavelength range of the combined laser beam. As such, one photodiode can be used to measure the combined optical power provided by the red, green and blue lasers. Again, such a configuration can provide accurate optical power measurement in a relatively compact device and with relatively low cost Turning now to FIG. 1, a schematic diagram of a scanning laser projector 100 is illustrated. The scanning laser projector 100 includes a laser light source 102, scanning mirror(s) 104, a drive circuit 106, and an optical power sensor 108. During operation, the laser light source 102 provides a beam of laser light is encoded with pixel data to generate image pixels that are to be projected by the scanning laser projector 100. To facilitate this, the drive circuit 106 controls the movement of the scanning mirror(s) 104. Specifically, the drive circuit 106 provides excitation signal(s) to excite motion of the scanning mirror(s) 104.

The scanning mirror(s) 104 reflect the laser beam into an image region 112. Specifically, during operation of the scanning light projector 100, the scanning mirror(s) 104 are controlled by the drive circuit 106 to reflect the beams of laser light into a raster pattern 114. This raster pattern 114 of laser beam generates a projected image. In general, the horizontal motion of the beam of laser light in this raster pattern 114 define rows of pixels in the projected image, while the vertical motion of the beams of laser light in the raster pattern 114 defines a vertical scan rate and thus the number of rows in the projected image.

In accordance with the embodiments described herein, the optical power sensor 108 is inserted into the optical path of the scanning laser projector 100 to provide a measure of the optical power generated by the laser light source 102. In general, the optical power sensor 108 utilizes a filter component and photodiode to measure optical power being generated by the laser light source 102, with the filter component configured to at least partially compensate for the non-uniform electric current response of the photodiode. The scanning mirror(s) 104 are configured to reflect the laser beam, and the drive circuit 106 is configured to provide an excitation signal to excite motion of the scanning mirror(s) 104. Specifically, the motion is excited such that the scanning mirror(s) 104 reflect the laser beam in the raster pattern 114 of scan lines to form a projected image Turning now to FIG. 2, a more detailed embodiment of an optical power sensor 200 is illustrated. The optical power sensor 200 includes a beam splitter 202, a filter component 204, and a photodiode 206. Again, the optical power sensor 200 is inserted into the optical path of a scanning laser projector to provide an accurate measure of the optical power being provided by the laser light source 102. When so configured, the measure of the optical power can be used as a feedback for control of the laser light source 102.

Figure 2:
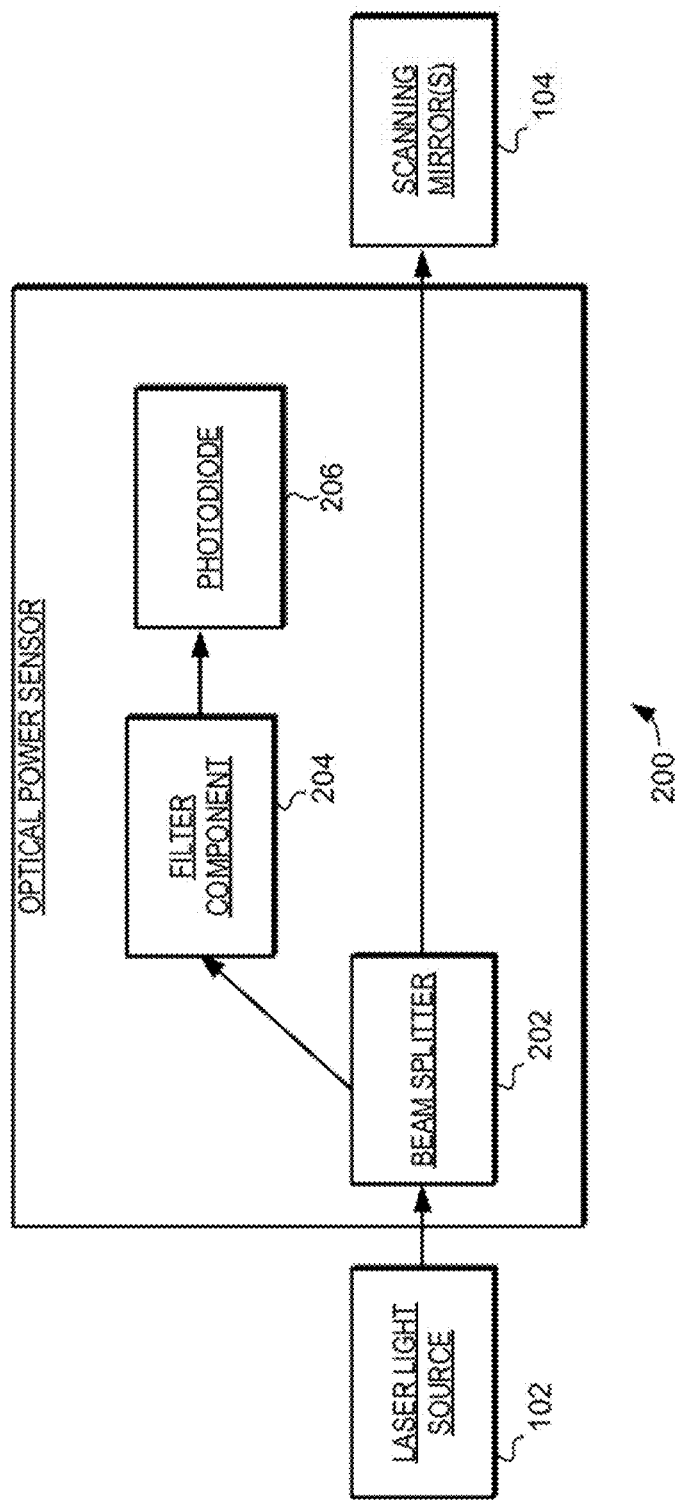
FIG. 2. shows a schematic view of an optical power sensor in accordance with various embodiments of the present invention.

It should be noted that while FIG. 2 shows the optical power sensor receiving the laser light directly from the laser light source 102, that this is just one example embodiment. In other embodiments there can be additional optical elements inserted between the laser light source 102 and the optical power sensor 200. Furthermore, there can be additional optical elements inserted between the optical power sensor 200 and the scanning mirrors 104. Specific examples of such other elements will be discussed in greater detail below with reference to the detailed embodiments illustrated in FIG. 5.

In general, the optical power sensor 200 uses the beam splitter 202, the filter component 204, and the photodiode 206 to measure the optical power outputted by the laser light source 102.

In one embodiment, the laser light source 102 includes multiple sources to generate a combined laser beam. For example, the laser light source 102 can include red, green and blue lasers that are combined into a single laser beam. Because it is formed with lasers of different colors, the combined laser beam will have a relatively large wavelength range. For example, the combined laser beam can have a wavelength range that extends from 450 nm to 650 nm. The photodiode 206, as is typical with such photodiodes, can have a significant non-uniform electric current response when impacted with a laser beam having such a relatively large wavelength range. For example, a typical photodiode will generate significantly more current when impacted with red laser light compared to the current generated by the same power amount of blue laser light. Such a non-uniform electric current response can thus lead to significant inaccuracy in power measurement when such a photodiode is used to measure the optical power in a laser beam having such a large wavelength range.

Thus, in accordance with the embodiments described herein, the optical power sensor 200 is configured such that filter component 204 at least partially compensates for this non-uniform electric current response over the wavelength range of the combined laser beam.

In other embodiments the laser light source 102 can include infrared lasers, and in such embodiments the photodiode 206 can be configured to measure optical power in infrared laser beams. And again, such a photodiode can have a non-uniform electric current response that can be compensated for using the filter component 204.

In this illustrated embodiment the optical power sensor 200 receives the laser beam at the beam splitter 202, and the beam splitter 202 splits the laser beam into a first portion and a second portion. The first portion of the laser beam is directed to the filter component 204 for optical power measurement, while the second portion of the laser beam is directed to the scanning mirrors 104 for image projection. In a typical embodiment the first portion of the laser beam directed toward filter component 204 will contain only a small percentage (e.g., less than 1%) of the overall optical power generated by the laser light source 102. Directing only a small percentage of the laser beam to the filter component assures that a majority of the optical power is sent to the projected image and thus increases the overall power efficiency of the scanning laser projector.

A variety of devices can be implemented as the beam splitter 202. For example, the beam splitter can be implemented as an uncoated glass window positioned to receive the laser beam at a determined angle of incidence. Examples of such implementations will be described in FIGS. 3A-3E below. Other examples of how the beam splitter 202 can be implemented include coated windows and optical cubes configured for beam splitting.

The first portion of the laser beam is directed by the beam splitter 202 to the filter component 204. In general, the filter component 204 is configured to filter the first portion of the laser beam in a way that at least partially compensates for the non-uniform electric current response of the photodiode 206. This compensated light is directed toward the photodiode 206 for optical power measurement.

In one embodiment the filter component 204 comprises an optical element having an input surface and an output surface. The input surface includes a first coating, where the first coating has a spectral response approximating an inverse of the photodiode non-uniform electric current response over the wavelength range. Specially, the optical element and the first coating are implemented such that spectral response of the first coating filters the first portion of the laser beam in a way that at least partially compensates for the non-uniform electric current response of the photodiode 206.

A variety of structures and coatings can be used to implement the optical element and first coating. For example, the optical element can be implemented with a glass rectangle or glass wedge.

The first coating can be implemented to reflect light toward photodiode 206, and in such an embodiment the spectral response used to filter the first portion of the laser beam would comprise a reflection spectral response. Conversely, the first coating can be implemented to transmit light toward the photodiode 206, and in such an embodiment the spectral response used to the filter the first portion of the laser beam would comprise a transmission spectral response. A variety of materials and techniques can be used to the form such a first coating on the optical element. For example, the first coating can be formed with a dielectric coating.

As noted above, the first coating is configured to compensate for the non-uniform electric current response of the photodiode 206. Furthermore, the first coating can be configured to additionally compensate for non-uniformity caused by the beam splitter 202. For example, the first coating can be configured to additionally compensate for non-uniformity caused by dispersion of the beam splitter material that occurs when the laser beam is reflected from the beam splitter 202. For example, such non-uniformity can be caused by wavelength dependent variation in the percentage of light intensity reflected by the beam splitter 202. In some applications the power reflected from the beam splitter 202 can be non-uniform across the wavelength range. In general, such non-uniformity is not as significant as the non-uniformity of the photodiode 206, but it can be non-negligible. Furthermore, in an uncoated beam splitter, the power reflected from the beam splitter 202 may depend on its polarization as well (e.g., for a 45 degree incidence angle, S polarization light generally reflects more than P polarization light) and the laser beam angle of incidence. In both cases, the first coating on the filter component 204 can be designed for inversing the current response of the photodiode 206 plus any non-uniform response of reflected power from the beam splitter.

In addition to the first coating, in some embodiments a second coating can be applied to an output surface of the optical element. Such a second coating can be implemented to provide an antireflective coating. In other embodiments the second coating can be implemented to provide an absorptive coating.

Figure 3A:
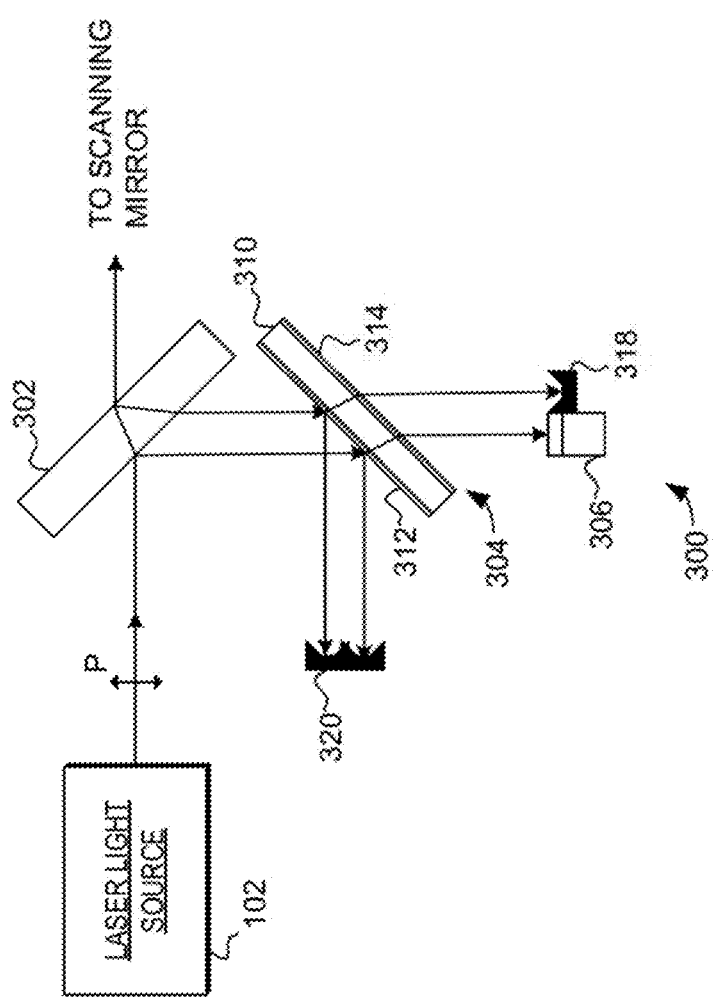

Turning now to FIGS. 3A-3E, various detailed examples of optical power sensors are illustrated. Specifically, FIG. 3A illustrates a more detailed embodiment of an optical power sensor 300. The optical power sensor 300 includes a beam splitter 302, a filter component 304, and a photodiode 306. Again, the optical power sensor 300 is inserted into the optical path of a scanning laser projector to provide an accurate measure of the optical power being provided by the laser light source 102.

In this embodiment, the beam splitter 302 receives the laser beam and splits the laser beam into a first portion and a second portion. The first portion of the laser beam is directed to the filter component 304, while the second portion of the laser beam is directed to the scanning mirrors for image projection.

In this illustrated embodiment the beam splitter 302 comprises an uncoated glass window positioned to receive the laser beam at a specific angle of incidence, with that angle of incidence selected to cause reflection of the first portion of light toward the filter component 304 while the second portion passes through the glass window and to the scanning mirrors. It should be noted that by precise configuration of the beam splitter 302 (e.g., the material and angle of incidence) a selected percentage of the laser beam can be directed toward the filter element.

Again, the first portion of the laser beam is directed by the beam splitter 302 to the filter component 304. In this illustrated embodiment, the filter component 304 includes an optical element 310 having an input surface and an output surface. Specifically, the optical element in FIG. 3A comprises a glass rectangle having an input surface and an output surface. The input surface of the optical element 310 includes a first coating 312, where the first coating has a spectral response approximating an inverse of the photodiode 306 non-uniform electric current response over the wavelength range of interest. Specially, the optical element 310 and the first coating 312 are implemented such that spectral response of the first coating 312 filters the first portion of the laser beam in a way that at least partially compensates for the non-uniform electric current response of the photodiode 306 over the wavelengths provided by the laser light source 102. Specifically, in this embodiment the optical element 310 and the first coating 312 are configured to transmit light through the optical element 310 toward the photodiode 306. In such an embodiment, the spectral response of the first coating 312 used to the filter the first portion of the laser beam would comprise a transmission spectral response.

In this embodiment the output surface of the optical element 310 includes a second coating 314. Specifically, in this embodiment the second coating 314 on the output surface is antireflective coating. This antireflective coating can reduce the second reflection of the beam on the back surface, which could otherwise result in ghosting.

As noted above, the optical element 310 and the first coating 312 are configured to transmit light through the optical element 310 toward the photodiode 306. The photodiode 306 generates a current responsive to the incident, and that current can be used to provide a measure of the optical power generated by the laser light source 102. Furthermore, in this embodiment light sinks 318 and 320 are provided to absorb stray light that could otherwise reflect further and interfere with the operation of the scanning laser projector. In this embodiment, the light sink 318 is configured to absorb stray laser light transmitted through the filter component 304, while the light sink 320 is configured to absorb stray laser light reflected by the filter component 304. The light sinks 318 and 320 can be implemented with suitable black painted surfaces or other optical absorbing materials.

Figure 3B:
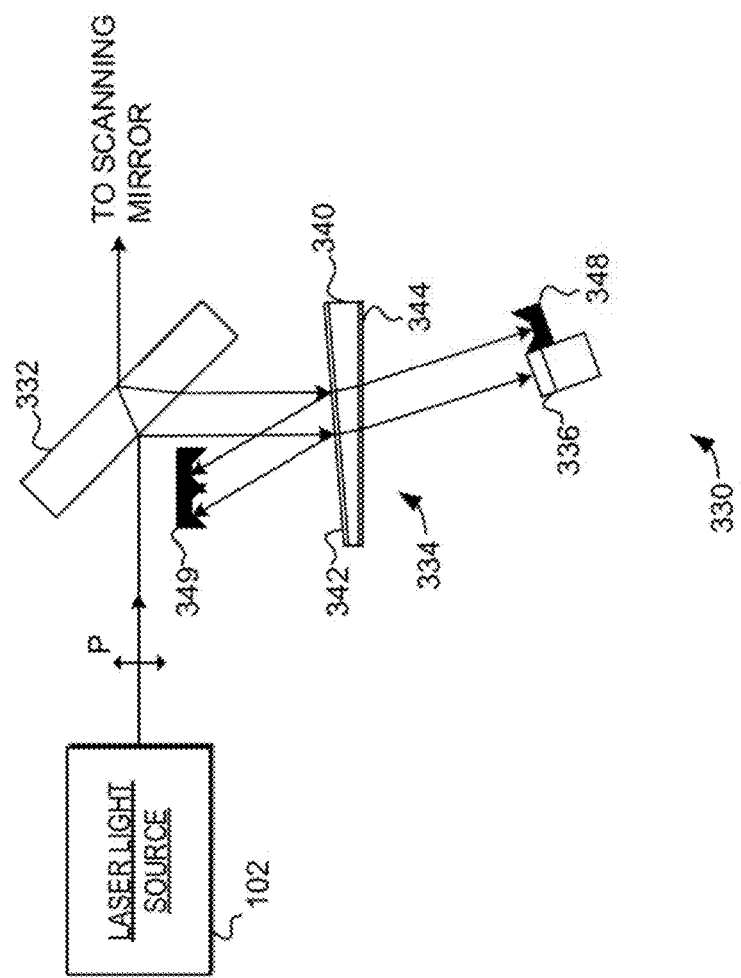

Turning now to FIG. 3B, another detailed embodiment of an optical power sensor 330 is illustrated. The optical power sensor 330 includes a beam splitter 332, a filter component 334, and a photodiode 336. Again, the optical power sensor 330 is inserted into the optical path of a scanning laser projector to provide an accurate measure of the optical power being provided by the laser light source 102.

Again, the beam splitter 332 receives the laser beam and splits the laser beam into a first portion and a second portion. The first portion of the laser beam is directed to the filter component 334, while the second portion of the laser beam is directed to the scanning mirrors for image projection. Like the previous embodiment, the beam splitter 332 comprises an uncoated glass window positioned to receive the laser beam at a specific angle of incidence, with that angle of incidence selected to cause reflection of the first portion of light toward the filter component 334 while the second portion passes through the glass window and to the scanning mirrors.

In this illustrated embodiment, the filter component 334 includes an optical element 340 having an input surface and an output surface. Specifically, the optical element in FIG. 3B comprises a glass wedge having an input surface and an output surface. The input surface of the optical element 340 includes a first coating 342, where the first coating has a spectral response approximating an inverse of the photodiode 336 non-uniform electric current response over the wavelength range of interest. Specifically, in this embodiment the optical element 340 and the first coating 342 are configured to transmit light through the optical element 340 toward the photodiode 336. In such an embodiment, the spectral response of the first coating 342 used to the filter the first portion of the laser beam would comprise a transmission spectral response.

In this embodiment the output surface of the optical element 340 includes a second coating 344. Specifically, in this embodiment the second coating 344 on the output surface is antireflective coating.

Again, the optical element 340 and the first coating 342 are configured to transmit light through the optical element 340 toward the photodiode 336. The photodiode 336 generates a current responsive to the incident, and that current can be used to provide a measure of the optical power generated by the laser light source 102. Furthermore, in this embodiment light sinks 348 and 349 are provided to absorb stray light that could otherwise reflect further and interfere with the operation of the scanning laser projector.

Turning now to FIG. 3C, another detailed embodiment of an optical power sensor 350 is illustrated. The optical power sensor 350 includes a beam splitter 352, a filter component 354, and a photodiode 356. Again, the optical power sensor 350 is inserted into the optical path of a scanning laser projector to provide an accurate measure of the optical power being provided by the laser light source 102.

Again, the beam splitter 352 receives the laser beam and splits the laser beam into a first portion and a second portion. The first portion of the laser beam is directed to the filter component 354, while the second portion of the laser beam is directed to the scanning mirrors for image projection. Like the previous embodiment, the beam splitter 352 comprises an uncoated glass window positioned to receive the laser beam at a specific angle of incidence, with that angle of incidence selected to cause reflection of the first portion of light toward the filter component 354 while the second portion passes through the glass window and to the scanning mirrors.

In this illustrated embodiment, the filter component 354 includes an optical element 360 having an input surface and an output surface. Specifically, the optical element in FIG. 3C comprises a glass rectangle having an input surface and an output surface. The input surface of the optical element 360 includes a first coating 362, where the first coating has a spectral response approximating an inverse of the photodiode 356 non-uniform electric current response over the wavelength range of interest. Specifically, in this embodiment the optical element 360 and the first coating 362 are configured to reflect light through the optical element 340 toward the photodiode 336. In such an embodiment, the spectral response of the first coating 362 used to the filter the first portion of the laser beam would comprise a reflection spectral response.

In this embodiment the output surface of the optical element 360 includes a second coating 364. Specifically, in this embodiment the second coating 364 on the output surface is antireflective coating.

Again, the optical element 360 and the first coating 362 are configured to reflect light toward the photodiode 356. The photodiode 356 generates a current responsive to the incident, and that current can be used to provide a measure of the optical power generated by the laser light source 102.

Furthermore, in this embodiment light sinks 358 and 359 are provided to absorb stray light that could otherwise reflect further and interfere with the operation of the scanning laser projector.

Figure 3D:
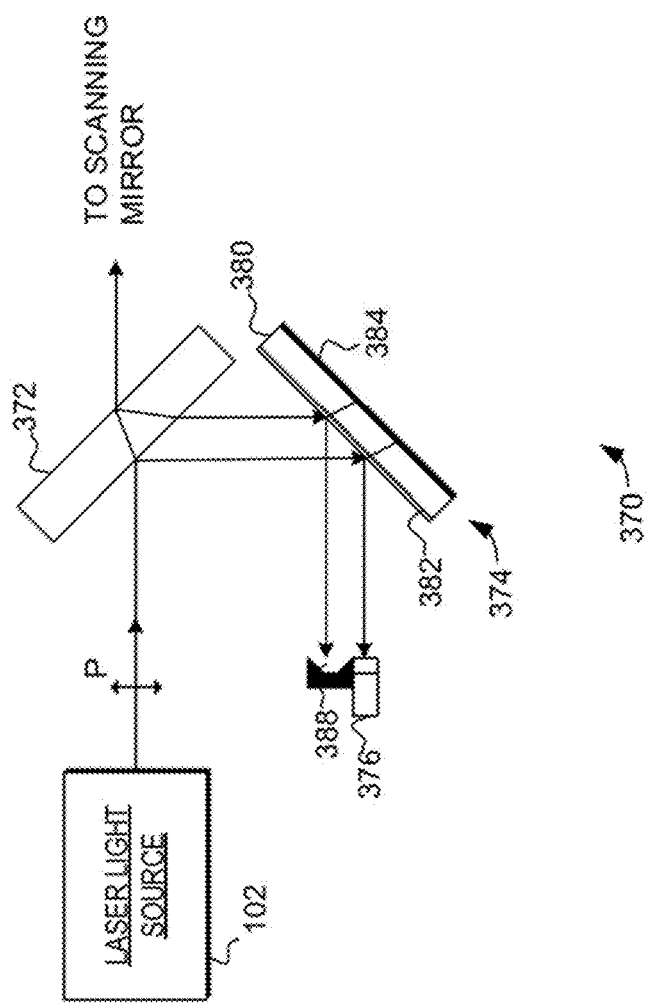

Turning now to FIG. 3D, another detailed embodiment of an optical power sensor 370 is illustrated. The optical power sensor 370 includes a beam splitter 372, a filter component 374, and a photodiode 376. Again, the optical power sensor 370 is inserted into the optical path of a scanning laser projector to provide an accurate measure of the optical power being provided by the laser light source 102.

This embodiment is similar to the optical power sensor 350 illustrated in FIG. 3C. Thus, the filter component 374 includes an optical element 380 having an input surface and an output surface. And again, the input surface of the optical element 380 includes a first coating 382, where the first coating has a reflection spectral response approximating an inverse of the photodiode 376 non-uniform electric current response over the wavelength range of interest.

However, in this embodiment the output surface of the optical element 380 has a second coating 384 that functions as an absorptive coating. Thus, instead of light passing through the optical element 380 and being absorbed by a light sink (e.g., light sink 368) such light is absorbed by the second coating 384. Likewise, light does not reflect back from the second coating 384 and toward the direction of the photodiode 376. Thus, this embodiment can reduce the number of light sinks needed to prevent unwanted reflection of the laser light. Instead, only light sink 388 may be needed to reduce unwanted reflections.

Figure 3E:
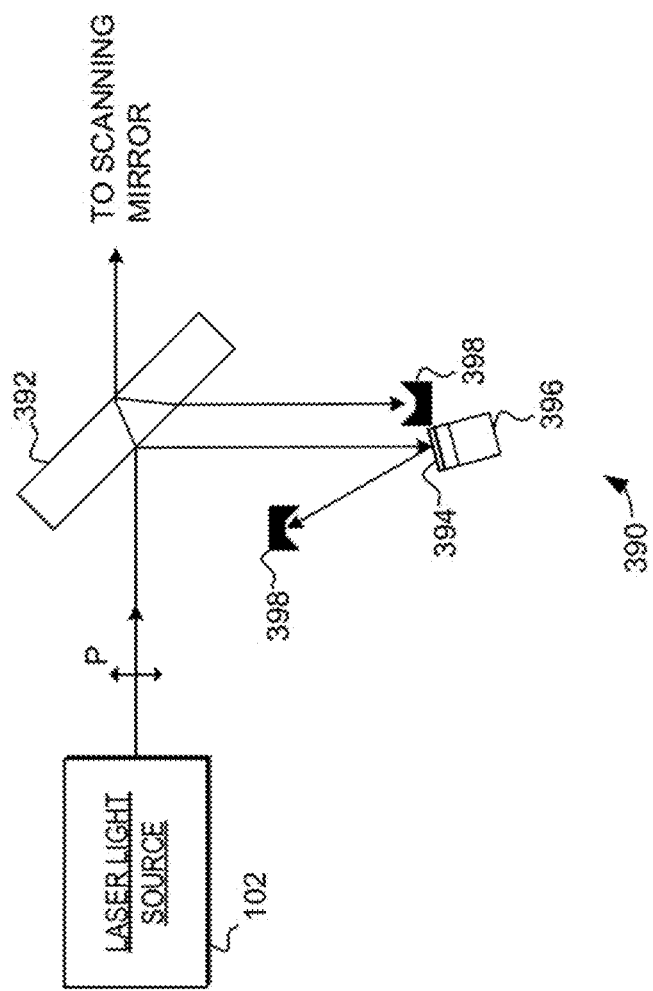

Turning now to FIG. 3E, another detailed embodiment of an optical power sensor 390 is illustrated. The optical power sensor 390 includes a beam splitter 392, a filter component 394, and a photodiode 396. Again, the optical power sensor 390 is inserted into the optical path of a scanning laser projector to provide an accurate measure of the optical power being provided by the laser light source 102.

In this embodiment, the beam splitter 392 is similar to the previous embodiments. However, in contrast with the previous embodiments, the filter component 394 in this embodiment is affixed directly to the input surface of the photodiode 396. This facilitates a compact implementation of the optical power sensor 390.

In such an embodiment the filter component 394 can be affixed to the photodiode 396 using deposition or growth techniques. For example, a suitable coating can be formed using a dielectric coating growth technique.

Like the previous embodiments, this embodiment uses light sinks 398 to absorb laser light and reduce unwanted reflections.

As was discussed above, in a typical scanning laser projector, the laser light source can include red, green and blue lasers that are combined into a single laser beam. Because it is formed with lasers of different colors, the combined laser beam will have a relatively large wavelength range. Photodiodes typically have a significant non-uniform electric current response when impacted with a laser beam having such a relatively large wavelength range.

For example, a typical photodiode will generate significantly more current when impacted with red laser light compared to the current generated by the same power amount of blue laser light. Turning now to FIG. 4A, a graphical representation of an exemplary photodiode electric current response is illustrated in graph 400. Specifically, graph 400 illustrates the normalized electric current response of a photodiode in response from blue laser light (e.g., 400 nm) to red laser light (e.g., 650 nm). As can be seen in graph 400, the electric current response of the photodiode is reduced for blue and green wavelength, with the electric current response for blue laser light being only 70% of the red laser light electric current response.

Thus, the current generated by such a photodiode when laser light having such a large wavelength range is impacting the photodiode would not provide an accurate measurement of the overall optical power. Such a non-uniform electric current response can thus lead to significant inaccuracy in power measurement when such a photodiode is used to measure the optical power.

Thus, the embodiments described herein utilize a filter component to at least partially compensate for the non-uniform electric current response of the photodiode. Specifically, the spectral response of the filter component is selected to at least partially cancel out and compensate for the non-uniform electric current response of the photodiode. Turning to FIG. 4, a graphical representation of an exemplary spectral response is illustrated in graph 450. As can be seen in graph 450, the spectral response of the filter component (e.g., the spectral response of the first coating) approximates the inverse of the electric current response illustrated in graph 400. Such a spectral response in the filter component can thus at least partially compensate for the non-uniform electric current response of the photodiode, and thus can provide for accurate optical power measurement.

Figure 5:
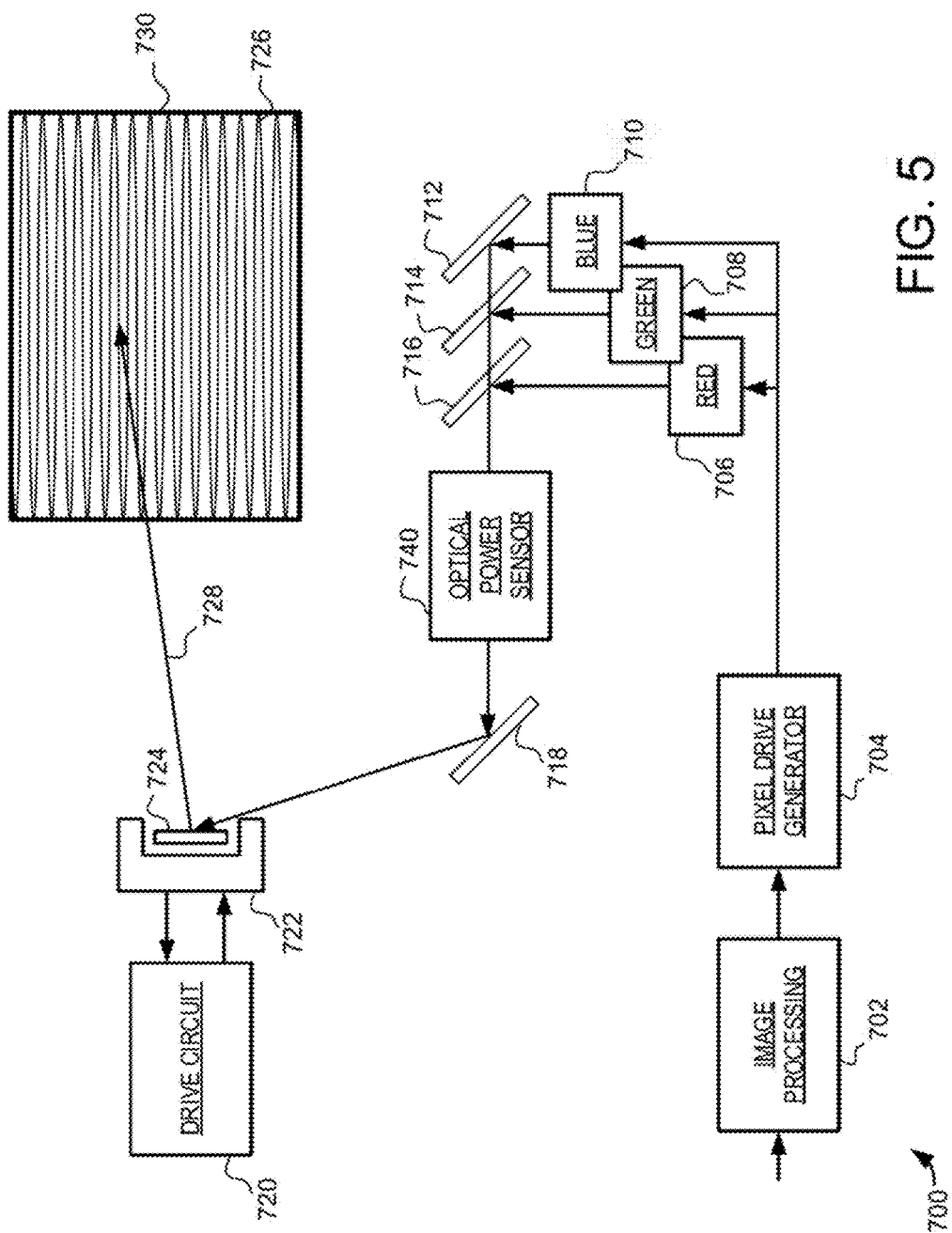
FIG. 5 shows a schematic view of a scanning laser projector in accordance with various embodiments of the present invention.

Turning now to FIG. 5, a schematic view of a scanning laser projector 700 is illustrated. The scanning laser projector 700 is a more detailed example of the type of system that can be used in accordance with various embodiments of the present invention. Scanning laser projector 700 includes an image processing component 702, a pixel drive generator 704, a red laser module 706, a green laser module 708, and a blue laser module 710. Light from the three laser modules is combined with dichroics 712, 714, and 716. Scanning laser projector 700 also includes fold mirror 718, drive circuit 720, and MEMS device 722 with scanning mirror 724.

In operation, image processing component 702 processes video content at using two dimensional interpolation algorithms to determine the appropriate spatial image content for each scan position at which an output pixel is to be displayed by the pixel drive generator. For example, the video content may represent a grid of pixels at any resolution (e.g., 640×480, 848×480, 1280×720, and 1920×1080). The input light intensity encoding typically represents the light intensity in 8, 10, 12 bit or higher resolutions.

This content is then mapped to a commanded current for each of the red, green, and blue laser sources such that the output intensity from the lasers is consistent with the input image content. In some embodiments, this process occurs at output pixel rates in excess of 150 MHz. The laser beams are then directed onto an ultra-high speed gimbal mounted 2 dimensional bi-axial laser scanning mirror 724. In some embodiments, this bi-axial scanning mirror is fabricated from silicon using MEMS processes. The vertical axis of rotation is operated quasi-statically and creates a vertical sawtooth raster trajectory. The vertical axis is also referred to as the slow-scan axis. The horizontal axis is operated on a resonant vibrational mode of the scanning mirror. In some embodiments, the MEMS device uses electromagnetic actuation, achieved using a miniature assembly containing the MEMS die and small subassemblies of permanent magnets and an electrical interface, although the various embodiments are not limited in this respect. For example, some embodiments employ electrostatic or piezoelectric actuation. Any type of mirror actuation may be employed without departing from the scope of the present invention.

The horizontal resonant axis is also referred to as the fast-scan axis. In some embodiments, raster pattern 726 is formed by combining a sinusoidal component on the horizontal axis and a sawtooth component on the vertical axis. In these embodiments, output beam 728 sweeps back and forth left-to-right in a sinusoidal pattern, and sweeps vertically (top-to-bottom) in a sawtooth pattern with the display blanked during flyback (bottom-to-top).

Figure 7:
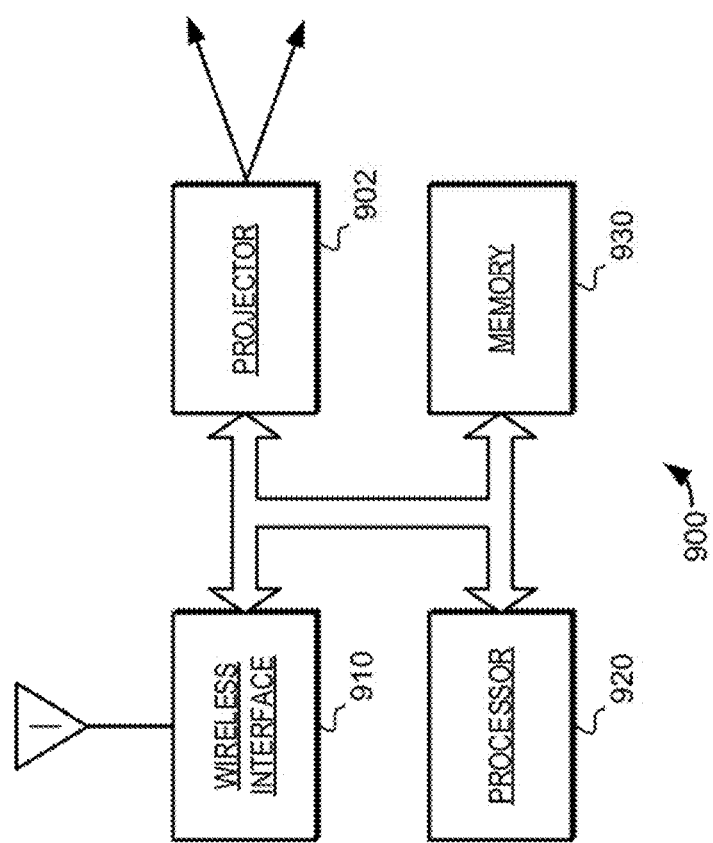
FIG. 7 shows a block diagram of a mobile device in accordance with various embodiments of the present invention.

It should be noted that FIG. 7 illustrates the sinusoidal pattern as the beam sweeps vertically top-to-bottom, but does not show the flyback from bottom-to-top. In other embodiments, the vertical sweep is controlled with a triangular wave such that there is no flyback. In still further embodiments, the vertical sweep is sinusoidal. The various embodiments of the invention are not limited by the waveforms used to control the vertical and horizontal sweep or the resulting raster pattern 726.

The drive circuit 720 provides a drive signal to MEMS device 722. The drive signal includes an excitation signal to control the resonant angular motion of scanning mirror 724 on the fast-scan axis, and also includes slow scan drive signal to cause deflection on the slow-scan axis. The resulting mirror deflection on both the fast and slow-scan axes causes output beam 728 to generate a raster scan 726 in an image region 730. In operation, the laser light sources produce light pulses for each output pixel and scanning mirror 724 reflects the light pulses as beam 728 traverses the raster pattern 726. Drive circuit 720 also receives a feedback signal from MEMS device 722. The feedback signal from the MEMS device 722 can describe the maximum deflection angle of the mirror, also referred to herein as the amplitude of the feedback signal. This feedback signal is provided to the drive circuit 720, and is used by the drive circuit 720 to accurately control the motion of the scanning mirror 724.

In operation, drive circuit 720 excites resonant motion of scanning mirror 724 such that the amplitude of the feedback signal is constant. This provides for a constant maximum angular deflection on the fast-scan axis as shown in raster pattern 726. The excitation signal used to excite resonant motion of scanning mirror 724 can include both amplitude and a phase. Drive circuit 720 includes feedback circuit(s) that modifies the excitation signal amplitude to keep the feedback signal amplitude substantially constant. Additionally, the drive circuit 720 can modify the excitation signal to control the horizontal phase alignment and vertical position of the raster pattern 726.

To facilitate this, drive circuit 720 may be implemented in hardware, a programmable processor, or in any combination. For example, in some embodiments, drive circuit 720 is implemented in an application specific integrated circuit (ASIC). Further, in some embodiments, some of the faster data path control is performed in an ASIC and overall control is provided by a software programmable microprocessor.

It should be noted that while FIG. 4 illustrates an embodiment with a single MEMS device 722 and a single scanning mirror 724, that this is just one example implementation. As another example, a scanning laser projector could instead be implemented with scanning mirror assembly that includes two scanning mirrors, with one mirror configured to deflect along one axis and another mirror configured to deflect along a second axis that is largely perpendicular to the first axis.

Such an embodiment could include a second MEMS device, a second scanning mirror, and a second drive circuit. The first scanning mirror could be configured to generate horizontal scanning motion, and the second scanning mirror configured to generate vertical motion. Thus, the motion of one scanning mirror determines the horizontal scan amplitude and the motion of the other scanning mirror determines the vertical scan amplitude.

Finally, although red, green, and blue laser light sources are shown in FIG. 7A, the various embodiments are not limited by the wavelength of light emitted by the laser light sources. For example, in some embodiments, non-visible light (e.g., infrared light) is emitted instead of, or in addition to, visible light.

In accordance with the embodiments described herein, an optical power sensor 740 is inserted into the optical path. The optical power sensor can be implemented with any of the various embodiments described above. As such, the optical power sensor 740 uses a filter component and photodiode to accurately measure optical power generated by laser modules 706, 708, and 710. It should be noted that in this embodiment the optical power sensor 740 operates on the laser light after the laser light of different colors (from red laser module 706, a green laser module 708, and a blue laser module 710) have been combined with the dichroics 712, 714, and 716. Thus, the optical power sensor 740 is configured to receive laser light from the laser modules 706, 708, and 710, and measure the optical power of the combined laser beams.

Figure 6:
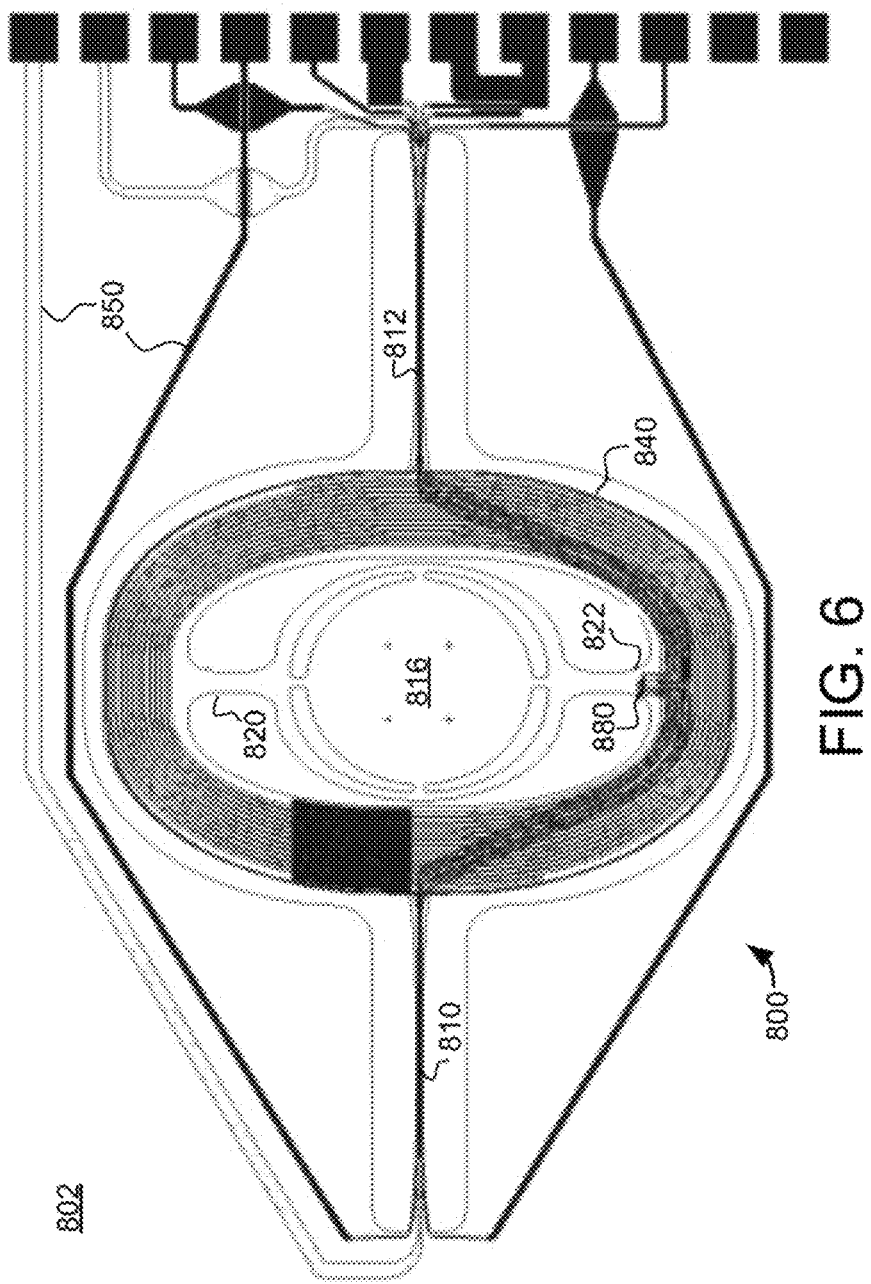
FIG. 6 shows a plan view of a microelectromechanical system (MEMS) device with a scanning mirror in accordance with various embodiments of the present invention.

Turning now to FIG. 6, a plan view of a microelectromechanical system (MEMS) device with a scanning mirror is illustrated. MEMS device 800 includes fixed platform 802, scanning platform 840, and scanning mirror 816. Scanning platform 840 is coupled to fixed platform 802 by flexures 810 and 812, and scanning mirror 16 is coupled to scanning platform 840 by flexures 820 and 822. Scanning platform 840 has a drive coil connected to drive lines 850, which are driven by a drive signal provided from a drive circuit (e.g., drive circuit 720). The drive signal includes an excitation signal to excite resonant motion of scanning mirror 816 on the fast-scan axis, and also includes a slow-scan drive signal to cause non-resonant motion of scanning platform 840 on the slow-scan axis. Current drive into drive lines 850 produces a current in the drive coil. In operation, an external magnetic field source (not shown) imposes a magnetic field on the drive coil. The magnetic field imposed on the drive coil by the external magnetic field source has a component in the plane of the coil, and is oriented non-orthogonally with respect to the two drive axes. The in-plane current in the coil windings interacts with the in-plane magnetic field to produce out-of-plane Lorentz forces on the conductors. Since the drive current forms a loop on scanning platform 840, the current reverses sign across the scan axes. This means the Lorentz forces also reverse sign across the scan axes, resulting in a torque in the plane of and normal to the magnetic field. This combined torque produces responses in the two scan directions depending on the frequency content of the torque.

The long axis of flexures 810 and 812 form a pivot axis. Flexures 810 and 812 are flexible members that undergo a torsional flexure, thereby allowing scanning platform 840 to rotate on the pivot axis and have an angular displacement relative to fixed platform 802. Flexures 810 and 812 are not limited to torsional embodiments as shown in FIG. 6. For example, in some embodiments, flexures 810 and 812 take on other shapes such as arcs, "S" shapes, or other serpentine shapes. The term "flexure" as used herein refers to any flexible member coupling a scanning platform to another platform (scanning or fixed), and capable of movement that allows the scanning platform to have an angular displacement with respect to the other platform.

Scanning mirror 816 pivots on a first axis formed by flexures 820 and 822, and pivots on a second axis formed by flexures 810 and 812. The first axis is referred to herein as the horizontal axis or fast-scan axis, and the second axis is referred to herein as the vertical axis or slow-scan axis. In some embodiments, scanning mirror 816 scans at a mechanically resonant frequency on the horizontal axis resulting in a sinusoidal horizontal sweep. Further, in some embodiments, scanning mirror 816 scans vertically at a nonresonant frequency, so the vertical scan frequency can be controlled independently.

In a typical embodiment the MEMS device 800 will also incorporates one or more integrated piezoresistive position sensors. For example, piezoresistive sensor 880 can be configured to produces a voltage that represents the displacement of mirror 816 with respect to scanning platform 840, and this voltage can be provided back to the drive circuit. Furthermore, in some embodiments, positions sensors are provided on one scan axis while in other embodiments position sensors are provided for both axes.

It should be noted that the MEMS device 800 is provided as an example, and the various embodiments of the invention are not limited to this specific implementation. For example, any scanning mirror capable of sweeping in two dimensions to reflect a light beam in a raster pattern may be incorporated without departing from the scope of the present invention. Also for example, any combination of scanning mirrors (e.g., two mirrors: one for each axis) may be utilized to reflect a light beam in a raster pattern. Further, any type of mirror drive mechanism may be utilized without departing from the scope of the present invention. For example, although MEMS device 800 uses a drive coil on a moving platform with a static magnetic field, other embodiments may include a magnet on a moving platform with drive coil on a fixed platform. Further, the mirror drive mechanism may include an electrostatic drive mechanism.

The scanning laser projectors described above (e.g., scanning laser projector 100 of FIG. 1) can be implemented in a wide variety of devices and for a wide variety of applications. Several specific examples of these types of devices will not be discussed with reference to FIGS. 7-12. In each case, the various embodiments described above can be implemented with or as part of such a device.

Turning to FIG. 7, a block diagram of a mobile device 900 in accordance with various embodiments is illustrated. Specifically, mobile device 900 is an example of the type of device in which a scanning laser projector as described above can be implemented (e.g., scanning laser projector 100, scanning laser projector 700). As shown in FIG. 7, mobile device 900 includes wireless interface 910, processor 920, memory 930, and scanning laser projector 902. Scanning laser projector 902 includes photodetector(s) configured in an over scanned region signal to provide feedback signal(s) as described above. Scanning laser projector 902 may receive image data from any image source.

For example, in some embodiments, scanning laser projector 902 includes memory that holds still images. In other embodiments, scanning laser projector 902 includes memory that includes video images. In still further embodiments, scanning laser projector 902 displays imagery received from external sources such as connectors, wireless interface 910, a wired interface, or the like.

Wireless interface 910 may include any wireless transmission and/or reception capabilities. For example, in some embodiments, wireless interface 910 includes a network interface card (NIC) capable of communicating over a wireless network. Also for example, in some embodiments, wireless interface 910 may include cellular telephone capabilities. In still further embodiments, wireless interface 910 may include a global positioning system (GPS) receiver. One skilled in the art will understand that wireless interface 910 may include any type of wireless communications capability without departing from the scope of the present invention.

Processor 920 may be any type of processor capable of communicating with the various components in mobile device 900. For example, processor 920 may be an embedded processor available from application specific integrated circuit (ASIC) vendors, or may be a commercially available microprocessor. In some embodiments, processor 920 provides image or video data to scanning laser projector 100. The image or video data may be retrieved from wireless interface 910 or may be derived from data retrieved from wireless interface 910. For example, through processor 920, scanning laser projector 902 may display images or video received directly from wireless interface 910. Also for example, processor 920 may provide overlays to add to images and/or video received from wireless interface 910, or may alter stored imagery based on data received from wireless interface 910 (e.g., modifying a map display in GPS embodiments in which wireless interface 910 provides location coordinates).

Figure 8:
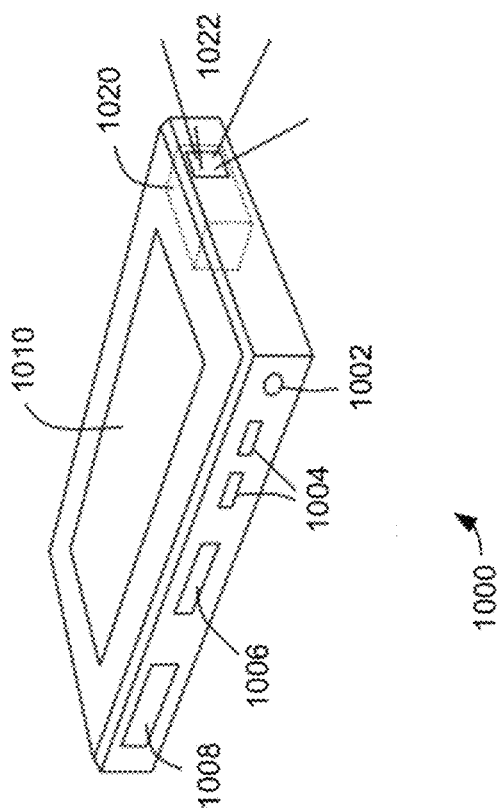
FIG. 8 shows a perspective view of a mobile device in accordance with various embodiments of the present invention.

Turning to FIG. 8, a perspective view of a mobile device 1000 in accordance with various embodiments is illustrated. Specifically, mobile device 1000 is an example of the type of device in which a scanning laser projector as described above can be implemented (e.g., scanning laser projector 100, scanning laser projector 700). Mobile device 1000 may be a hand held scanning laser projector with or without communications ability. For example, in some embodiments, mobile device 1000 may be a scanning laser projector with little or no other capabilities. Also for example, in some embodiments, mobile device 1000 may be a device usable for communications, including for example, a cellular phone, a smart phone, a tablet computing device, a global positioning system (GPS) receiver, or the like. Further, mobile device 1000 may be connected to a larger network via a wireless (e.g., cellular), or this device can accept and/or transmit data messages or video content via an unregulated spectrum (e.g., WiFi) connection.

Mobile device 1000 includes scanning laser projector 1020, touch sensitive display 1010, audio port 1002, control buttons 1004, card slot 1006, and audio/video (A/V) port 1008. None of these elements are essential. For example, mobile device may only include scanning laser projector 1020 without any of touch sensitive display 1010, audio port 1002, control buttons 1004, card slot 1006, or A/V port 1008. Some embodiments include a subset of these elements. For example, an accessory projector may include scanning laser projector 1020, control buttons 1004 and A/V port 1008. A smartphone embodiment may combine touch sensitive display device 1010 and projector 1020.

Touch sensitive display 1010 may be any type of display. For example, in some embodiments, touch sensitive display 1010 includes a liquid crystal display (LCD) screen. In some embodiments, display 1010 is not touch sensitive. Display 1010 may or may not always display the image projected by scanning laser projector 1020. For example, an accessory product may always display the projected image on display 1010, whereas a mobile phone embodiment may project a video while displaying different content on display 1010. Some embodiments may include a keypad in addition to touch sensitive display 1010. A/V port 1008 accepts and/or transmits video and/or audio signals. For example, A/V port 1008 may be a digital port, such as a high definition multimedia interface (HDMI) interface that accepts a cable suitable to carry digital audio and video data. Further, A/V port 1008 may include RCA jacks to accept or transmit composite inputs. Still further, A/V port 1008 may include a VGA connector to accept or transmit analog video signals.

In some embodiments, mobile device 1000 may be tethered to an external signal source through A/V port 1008, and mobile device 1000 may project content accepted through A/V port 1008. In other embodiments, mobile device 1000 may be an originator of content, and A/V port 1008 is used to transmit content to a different device.

Audio port 1002 provides audio signals. For example, in some embodiments, mobile device 1000 is a media recorder that can record and play audio and video. In these embodiments, the video may be projected by scanning laser projector 1020 and the audio may be output at audio port 1002.

Mobile device 1000 also includes card slot 1006. In some embodiments, a memory card inserted in card slot 1006 may provide a source for audio to be output at audio port 1002 and/or video data to be projected by scanning laser projector 1020. Card slot 1006 may receive any type of solid state memory device, including for example secure digital (SD) memory cards.

Figure 9:
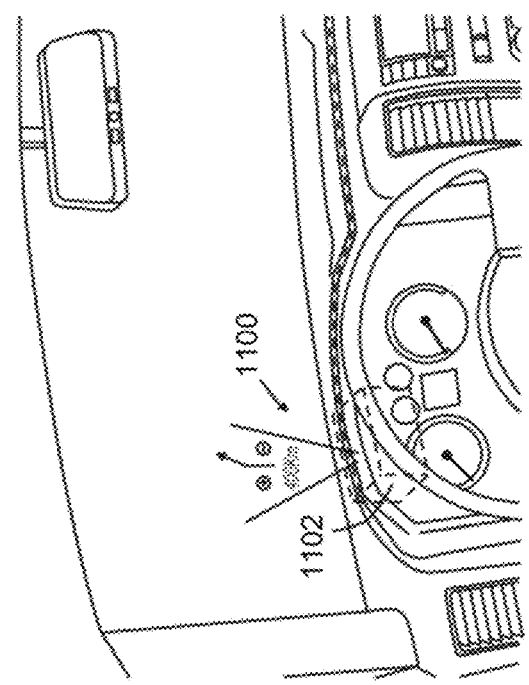
FIG. 9 shows a perspective view of a head-up display system in accordance with various embodiments of the present invention.
Figure 11:
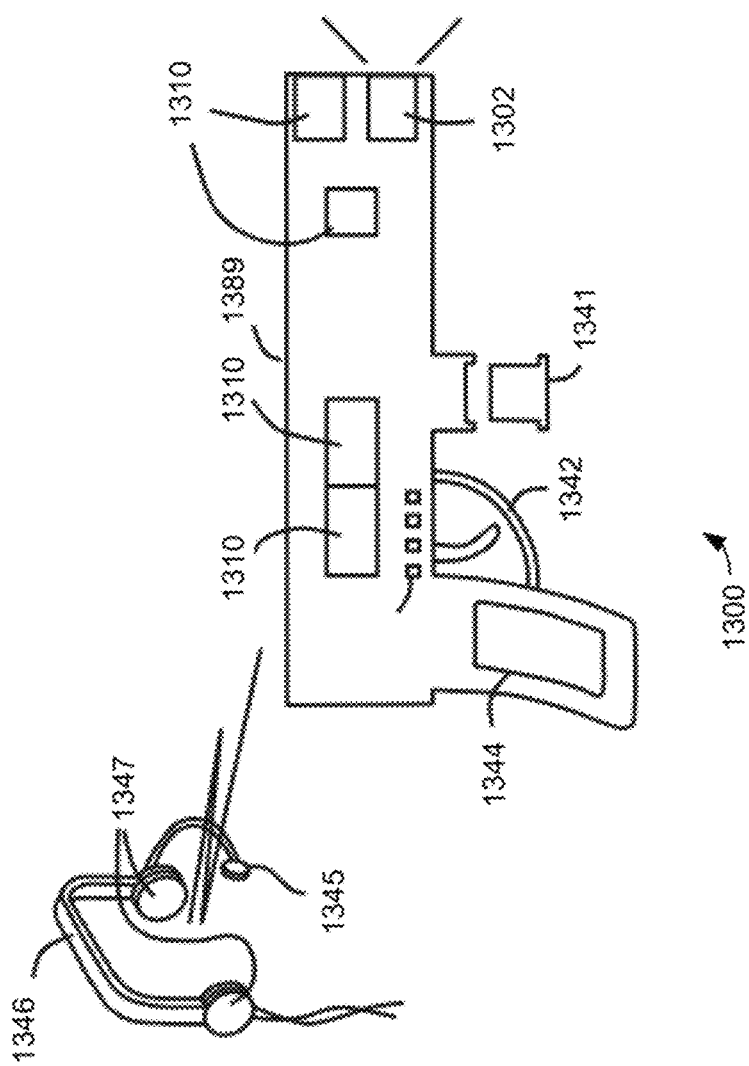
FIG. 11 shows a perspective view of a gaming apparatus in accordance with various embodiments of the present invention.

Turning to FIG. 9, a perspective view of a head-up display system 1100 in accordance with various embodiments is illustrated. Specifically, head-up display system 1100 is an example of the type of device in which a scanning laser projector as described above can be implemented (e.g., scanning laser projector 100, scanning laser projector 700). The head-up display system 1100 includes a scanning laser projector 1102. Specifically, the scanning laser projector 1102 is shown mounted in a vehicle dash to project the head-up display. Although an automotive head-up display is shown in FIG. 9, this is not a limitation and other applications are possible. For example, various embodiments include head-up displays in avionics application, air traffic control applications, and other applications.

Figure 10:
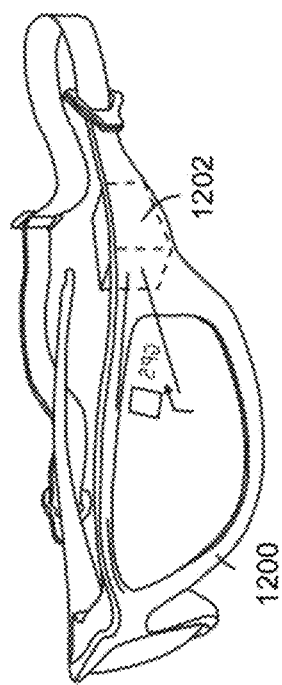
FIG. 10 shows a perspective view of eyewear in accordance with various embodiments of the present invention.

Turning to FIG. 10, a perspective view of eyewear 1200 in accordance with various embodiments is illustrated. Specifically, eyewear 1200 is an example of the type of device in which a scanning laser projector as described above can be implemented (e.g., scanning laser projector 100, scanning laser projector 700). Eyewear 1200 includes scanning laser projector 1202 to project a display in the eyewear's field of view. In some embodiments, eyewear 1200 is see-through and in other embodiments, eyewear 1200 is opaque. For example, eyewear 1200 may be used in an augmented reality application in which a wearer can see the display from projector 1202 overlaid on the physical world. Also for example, eyewear 1200 may be used in a virtual reality application, in which a wearer's entire view is generated by projector 1202.

Although only one projector 1202 is shown in FIG. 10, this is not a limitation and other implementations are possible. For example, in some embodiments, eyewear 1200 includes two projectors 1202, with one for each eye Turning to FIG. 11, a perspective view of a gaming apparatus 1300 in accordance with various embodiments is illustrated. Gaming apparatus 1300 allows a user or users to observe and interact with a gaming environment. In some embodiments, the game is navigated based on the motion, position, or orientation of gaming apparatus 1300, an apparatus that includes scanning laser projector 1302. Other control interfaces, such as manually-operated buttons, foot pedals, or verbal commands, may also contribute to navigation around, or interaction with the gaming environment. For example, in some embodiments, trigger 1342 contributes to the illusion that the user or users are in a first person perspective video game environment, commonly known as a "first person shooter game." Because the size and brightness of the projected display can be controlled by the gaming application in combination with the user's movement, gaming apparatus 1300 creates a highly believable or "immersive" environment for these users.

Many other first person perspective simulations can also be created by gaming apparatus 1300, for such activities as 3D seismic geo-prospecting, spacewalk planning, jungle canopy exploration, automobile safety instruction, medical education, etc. Tactile interface 1344 may provide a variety of output signals, such as recoil, vibration, shake, rumble, etc. Tactile interface 1344 may also include a touch-sensitive input feature, such as a touch sensitive display screen or a display screen that requires a stylus. Additional tactile interfaces, for example, input and/or output features for a motion sensitive probe are also included in various embodiments of the present invention.

Gaming apparatus 1300 may also include audio output devices, such as integrated audio speakers, remote speakers, or headphones. These sorts of audio output devices may be connected to gaming apparatus 1300 with wires or through a wireless technology. For example, wireless headphones 1346 provide the user with sound effects via a BLUETOOTH™ connection, although any sort of similar wireless technology could be substituted freely. In some embodiments, wireless headphones 1346 may include microphone 1345 or binaural microphone 1347, to allow multiple users, instructors, or observers to communicate. Binaural microphone 1347 typically includes microphones on each ear piece, to capture sounds modified by the user's head shadow.

This feature may be used for binaural hearing and sound localization by other simulation participants.

Gaming apparatus 1300 may include any number of sensors 1310 that measure ambient brightness, motion, position, orientation, and the like. For example, gaming apparatus 1300 may detect absolute heading with a digital compass, and detect relative motion with an x-y-z gyroscope or accelerometer. In some embodiments, gaming apparatus 1300 also includes a second accelerometer or gyroscope to detect the relative orientation of the device, or its rapid acceleration or deceleration. In other embodiments, gaming apparatus 1300 may include a Global Positioning Satellite (GPS) sensor, to detect absolute position as the user travels in terrestrial space.

Gaming apparatus 1300 may include battery 1341 and/or diagnostic lights 1343. For example, battery 1341 may be a rechargeable battery, and diagnostic lights 1343 could indicate the current charge of the battery. In another example, battery 1341 may be a removable battery clip, and gaming apparatus 1300 may have an additional battery, electrical capacitor or super-capacitor to allow for continued operation of the apparatus while the discharged battery is replaced with a charged battery. In other embodiments, diagnostic lights 1343 can inform the user or a service technician about the status of the electronic components included within or connected to this device. For example, diagnostic lights 1343 may indicate the strength of a received wireless signal, or the presence or absence of a memory card.

Diagnostic lights 1343 could also be replaced by any small screen, such as an organic light emitting diode or liquid crystal display screen. Such lights or screens could be on the exterior surface of gaming apparatus 1300, or below the surface, if the shell for this apparatus is translucent or transparent. Other components of gaming apparatus 1300 may be removable, detachable or separable from this device. For example, scanning laser projector 1302 may be detachable or separable from gaming housing 1389. In some embodiments, the subcomponents of scanning laser projector 100 may be detachable or separable from gaming housing 1389, and still function.

Figure 12:
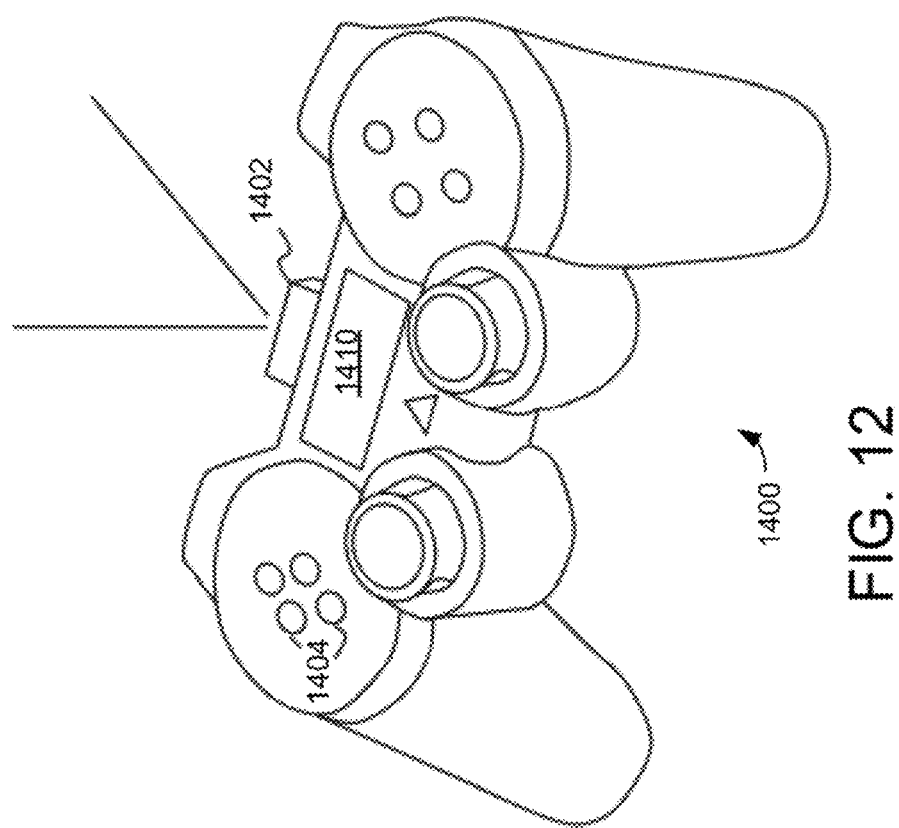
FIG. 12 shows a perspective view of a gaming apparatus in accordance with various embodiments of the present invention.

Turning to FIG. 12, a perspective view of a gaming apparatus 1400 in accordance with various embodiments is illustrated. Gaming apparatus 1400 includes buttons 1404, display 1410, and projector 1402. In some embodiments, gaming apparatus 1400 is a standalone apparatus that does not need a larger console for a user to play a game. For example, a user may play a game while watching display 1410 and/or the projected content. In other embodiments, gaming apparatus 1400 operates as a controller for a larger gaming console. In these embodiments, a user may watch a larger screen tethered to the console in combination with watching display 1410 and/or projected content.

In one embodiment, a scanning laser projector is provided, the scanning laser projector comprising: at least one source of laser light, the at least one source of laser light providing a laser beam having a wavelength range; an optical power sensor configured to receive the laser beam, the optical power sensor including: a photodiode, the photodiode having a non-uniform electric current response over the wavelength range; a filter component configured to receive a first portion of the laser beam and filter the first portion of the laser beam to at least partially compensate for the non-uniform electric current response of the photodiode, the filter component further configured to pass compensated laser light to the photodiode; at least one scanning mirror configured to reflect a second portion of the laser beam; and a drive circuit configured to provide an excitation signal to excite motion of the scanning mirror to reflect the second portion of the laser beam in a raster pattern of scan lines.

In another embodiment, a scanning laser projector is provided that comprises: at least one source of laser light, the at least one source of laser light providing a laser beam having a wavelength range; an optical power sensor configured to receive the laser beam, the optical power sensor including: a beam splitter beam configured to split the laser beam into a first portion and a second portion; a photodiode, the photodiode having a non-uniform electric current response over the wavelength range; and a filter component configured to receive a first portion of the laser beam, the filter component including an optical element having an input surface and an output surface, the input surface having a first coating with a spectral response approximating an inverse of the photodiode non-uniform electric current response over the wavelength range such that first coating at least partially compensates for the non-uniform electric current response of the photodiode, the filter component further configured to pass compensated laser light to the photodiode; at least one scanning mirror configured to reflect a second portion of the laser beam; and a drive circuit configured to provide an excitation signal to excite motion of the scanning mirror to reflect the second portion of the laser beam in a raster pattern of scan lines.

In another embodiment, a method of projecting an image is provided, the method comprising: generating a laser beam; splitting the laser beam into a first portion and a second portion; filtering the first portion of the laser beam to at least partially compensate for a non-uniform response of a photodiode; measuring optical power the filtered first portion of the laser beam with the photodiode; exciting motion of a scanning mirror to reflect the second portion of the laser beam in a raster pattern of scan lines.

In the preceding detailed description, reference was made to the accompanying drawings that show, by way of illustration, specific embodiments in which the invention may be practiced. These embodiments were described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The preceding detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A scanning laser projector, comprising:
at least one source of laser light, the at least one source of laser light providing a laser beam having a wavelength range;

an optical power sensor configured to receive the laser beam, the optical power sensor including:
- a photodiode, the photodiode having a non-uniform electric current response over the wavelength range;
- a filter component configured to receive a first portion of the laser beam and filter the first portion of the laser beam to at least partially compensate for the non-uniform electric current response of the photodiode, the filter component further configured to pass compensated laser light to the photodiode, wherein the filter component comprises an optical element having an input surface and an output surface, the input surface having a first coating with a spectral response approximating an inverse of the photodiode non-uniform electric current response over the wavelength range;

at least one scanning mirror configured to reflect a second portion of the laser beam; and a drive circuit configured to provide an excitation signal to excite motion of the scanning mirror to reflect the second portion of the laser beam in a raster pattern of scan lines.

2. The scanning laser projector of claim 1, wherein the first coating is further configured to compensate for dispersion in the first portion of the laser beam.

3. The scanning laser projector of claim 1, wherein the optical element comprises a glass rectangle.

4. The scanning laser projector of claim 1, wherein the optical element comprises a glass wedge.

5. The scanning laser projector of claim 1, wherein the optical element is configured to transmit a portion of the first portion of the laser beam to the photodiode.

6. The scanning laser projector of claim 1, wherein the optical element is configured to reflect a portion of the first portion of the laser beam to the photodiode.

7. The scanning laser projector of claim 1, wherein the optical element includes a second coating on the output surface.

8. The scanning laser projector of claim 7, wherein the second coating comprises an antireflective coating.

9. The scanning laser projector of claim 7, wherein the second coating comprises an absorptive coating.

10. The scanning laser projector of claim 1, wherein the filter component is affixed to an input surface of the photodiode.

11. The scanning laser projector of claim 1, wherein the optical power sensor further comprises a beam splitter configured to split the laser beam into the first portion and the second portion.

12. The scanning laser projector of claim 11, wherein the beam splitter comprises an uncoated glass window positioned to receive the laser beam at a determined angle of incidence.

13. A scanning laser projector, comprising:
at least one source of laser light, the at least one source of laser light providing a laser beam having a wavelength range;
an optical power sensor configured to receive the laser beam, the optical power sensor including:
- a beam splitter configured to split the laser beam into a first portion and a second portion;
- a photodiode, the photodiode having a non-uniform electric current response over the wavelength range; and
- a filter component configured to receive the first portion of the laser beam, the filter component including an optical element having an input surface and an output surface, the input surface having a first coating with a spectral response approximating an inverse of the photodiode non-uniform electric current response over the wavelength range such that the first coating at least partially compensates for the non-uniform electric current response of the photodiode, the filter component further configured to pass compensated laser light to the photodiode;

at least one scanning mirror configured to reflect the second portion of the laser beam, and a drive circuit configured to provide an excitation signal to excite motion of the scanning mirror to reflect the second portion of the laser beam in a raster pattern of scan lines.

14. A method of projecting an image, comprising:
generating a laser beam;
splitting the laser beam into a first portion and a second portion;
filtering the first portion of the laser beam to at least partially compensate for a non-uniform response of a photodiode, wherein the filtering the first portion of the laser beam comprises filtering with an optical element having an input surface and an output surface, the input surface having a first coating with a spectral response approximating an inverse of the photodiode non-uniform electric current response over a wavelength range;
measuring optical power the filtered first portion of the laser beam with the photodiode; and
exciting motion of a scanning mirror to reflect the second portion of the laser beam in a raster pattern of scan lines.

15. The method of claim 14, wherein the first coating is further configured to compensate for dispersion in the first portion of the laser beam.

16. The method of claim 14, wherein the optical element includes a second coating on the output surface.

17. The method of claim 14, wherein the filter component is affixed to an input surface of the photodiode.

* * * * *